(12) United States Patent
Chen

(10) Patent No.: US 8,830,066 B2
(45) Date of Patent: Sep. 9, 2014

(54) PACKAGE BAG WITH EXTERNALLY ATTACHED COMMUNICATION DEVICE

(71) Applicant: Taiwan Lamination Industries, Inc., Chung Li (TW)

(72) Inventor: Yung-Shun Chen, Chung Li (TW)

(73) Assignee: Taiwan Lamination Industries, Inc., Chung Li (TW)

( * ) Notice: Subject to any disclaimer, the term of this patent is extended or adjusted under 35 U.S.C. 154(b) by 121 days.

(21) Appl. No.: 13/693,467

(22) Filed: Dec. 4, 2012

(65) Prior Publication Data

US 2013/0315511 A1 Nov. 28, 2013

(30) Foreign Application Priority Data

May 23, 2012 (TW) .............................. 101118280 A

(51) Int. Cl.
| | |
|---|---|
| *G08B 13/14* | (2006.01) |
| *G06K 9/00* | (2006.01) |
| *A24F 27/00* | (2006.01) |
| *H01Q 13/10* | (2006.01) |
| *G06K 19/077* | (2006.01) |
| *H01Q 1/22* | (2006.01) |

(52) U.S. Cl.
CPC .......... *G06K 19/07745* (2013.01); *H01Q 13/10* (2013.01); *H01Q 1/2225* (2013.01); *G06K 19/07773* (2013.01); *G06K 19/07771* (2013.01); *G06K 19/07794* (2013.01)
USPC .................. 340/572.1; 340/572.7; 340/572.8; 382/109; 382/12; 206/119; 343/770

(58) Field of Classification Search
CPC ................... B65D 2203/10; G06K 19/07773; B32B 2519/02
USPC ........... 340/572.1, 572.7, 572.8; 383/109, 12; 206/119
See application file for complete search history.

(56) References Cited

U.S. PATENT DOCUMENTS

| | | | |
|---|---|---|---|
| 6,107,920 A * | 8/2000 | Eberhardt et al. .......... | 340/572.7 |
| 2003/0052786 A1 * | 3/2003 | Dickinson ................... | 340/572.8 |
| 2006/0208899 A1 * | 9/2006 | Suzuki et al. .............. | 340/572.7 |
| 2006/0220868 A1 * | 10/2006 | Takasawa et al. .......... | 340/572.1 |
| 2009/0096609 A1 * | 4/2009 | Huang et al. ............... | 340/572.1 |
| 2010/0177991 A1 * | 7/2010 | Chen ............................. | 383/109 |
| 2010/0177993 A1 * | 7/2010 | Chen ............................. | 383/207 |

* cited by examiner

*Primary Examiner* — George Bugg
*Assistant Examiner* — Munear Akki
(74) *Attorney, Agent, or Firm* — Bacon & Thomas, PLLC

(57) ABSTRACT

The present invention is to provide a package bag having a metal layer, wherein the metal layer is formed with a first groove and a second groove, and the second groove has a first side extending to one edge of the metal layer and a second side away from said edge and communicating vertically with a central section of a first side of the first groove. The second side of the second groove is shorter than the first side of the first groove, such that the portions of the metal layer adjacent to the first side of the first groove form two first impedance-matching portions respectively, and the two corresponding portions of the metal layer adjacent to the first groove form two second impedance-matching portions respectively. Thus, due to the impedance-matching portions, a slot antenna can be formed on the metal layer for coupling with a communication device attached thereto.

8 Claims, 9 Drawing Sheets

PACKAGE BAG WITH EXTERNALLY ATTACHED COMMUNICATION DEVICE

FIELD OF THE INVENTION

The present invention relates to a package bag, more particularly to a package bag having a communication device externally attached to a slot antenna formed thereon, wherein, since there are impedance-matching portions formed between the slot antenna and the communication device, the slot antenna can be made in a smallest size for achieving a desired transmission distance.

BACKGROUND OF THE INVENTION

Radio frequency identification (RFID) is a technology whereby specific targets can be identified, and related data can be read and written, via radio frequency (RF) signals. Thanks to the RFID technology, an RFID tag can be provided on the package bag of an article, so as for a reader within a predetermined distance from the article to obtain the data (e.g., the year of manufacture, the expiration date, etc.) stored in the RFID tag. Compared with barcode technology, RFID not only features a larger storage capacity, but also is more convenient to use, for there is no need to establish mechanical or optical contact with RFID tags. Hence, RFID has been extensively used in preventive measures for counterfeit banknotes, verification mechanisms for identification cards, electronic fare collection systems, and electronic pedigrees, to name only a few examples. Today, RFID is as ubiquitous as important in people's daily lives.

RFID tags can be divided, according to their sources of energy, into three categories: passive, semi-passive, and active. Take the most common passive RFID tags nowadays for instance. The passive RFID tag 1 shown in FIG. 1 is composed of a substrate 11, a transceiver antenna 12, and a chip 13. The substrate 11 is typically made of polyimide. The transceiver antenna 12 is formed on the substrate 11 by an etching process, which generally includes attaching a copper foil to the substrate 11 and etching the copper foil according to a predesigned antenna configuration in order to form the transceiver antenna 12. The chip 13 has two ends respectively connected to the feed-in ends of the transceiver antenna 12. When a reader within a predetermined distance from the RFID tag 1 sends out an RF signal, the transceiver antenna 12 can, after receiving the signal, transmit the data stored in the chip 13 to the reader using energy generated from electromagnetic induction.

Referring to FIG. 1, the RFID tag 1 depends on the transceiver antenna 12 to receive and transmit RF signals and thereby drive the chip 13 in the tag to execute the corresponding procedures. When attached to a non-conductive article (e.g., a plastic package bag, paper, wood, etc.), the RFID tag 1 can perform signal transmission wherever possible, exchanging information with a reader within a predetermined distance. When the RFID tag 1 is attached to the surface of a metal article, however, the metal article will, according to the image theory, generate image pulses which are in antiphase, and hence destructively interfere, with the RF signals transmitted by the transceiver antenna 12. Once the RF signals are destroyed and rendered undeliverable to the reader, the reader will have problem reading the information in the RFID tag 1. Destructive interference refers to a phenomenon in which a peak of a wave and a valley of another wave arrive at the same point, and in which therefore the amplitude of the resultant wave is smaller than the amplitude of each of the component waves. If the amplitude of a wave completely cancels the amplitude of a destructively interfering wave, complete destructive interference takes place.

In today's logistics systems, it is common practice to package a to-be-delivered article in a package bag with a metal lining in order to keep the article dry, or prevent the article from rusting or growing mold, or protect the article from deterioration which may otherwise result from exposure to light. The most common example of such package bags is the electroplated aluminum foil bag, whose interior is electroplated with an aluminum foil. However, as stated above, the image pulse problem arises when the RFID tag 1 is provided on a packaging material with a metal lining. More particularly, attaching the RFID tag 1 to an electroplated aluminum foil bag will seriously compromise the readability of the RFID tag 1 or even reduce the read distance of the tag to approximately 0 meter, in which case the RFID tag 1 is practically unreadable. Furthermore, electroplated aluminum foil bags are typically used to package articles of relatively small sizes and relatively short shelf lives, but it is difficult to design inexpensive and compact RFID tags for use on electroplated aluminum foil bags without impairing the low-cost and small-size features of the bags. The lack of RFID tags suitable for use with electroplated aluminum foil bags adds to the inconvenience of logistics management.

Therefore, the issue to be addressed by the present invention is to improve the conventional package bags so that a package bag not only can have a moisture-proof and reflective metal layer, but also can be provided with an RFID tag to facilitate logistics management.

BRIEF SUMMARY OF THE INVENTION

To solve the problem that an RFID tag cannot be used with a package bag whose interior is electroplated with metal, the inventor of the present invention incorporated years of practical experience into extensive research and experiment and finally succeeded in developing a package bag with an externally attached communication device as disclosed herein.

It is an object of the present invention to provide a package bag having an externally attached communication device, wherein the package bag includes a surface material, a metal layer, and a bottom material, in addition to the communication device. The surface material is a film made of plastic and is provided with an outer groove. The metal layer has one surface coated on one surface of the surface material. The metal layer is formed with a first groove and a second groove, both corresponding in position to the outer groove. The first groove is adjacent to one edge of the metal layer. The second groove has a first side which extends to the aforesaid edge of the metal layer and a second side which is away from the aforesaid edge of the metal layer and communicates vertically with a central section of a first side of the first groove. The second side of the second groove is shorter than the first side of the first groove, such that the portions of the metal layer that are adjacent to the first side of the first groove form two first impedance-matching portions respectively. In addition, the two corresponding portions of the metal layer that are adjacent to the first groove form two second impedance-matching portions respectively. Thus, the first groove and the second groove of the metal layer form a slot antenna. The bottom material is a film made of plastic and has one surface coated on the other surface of the metal layer. The bottom material is provided with an inner groove corresponding in position to the slot antenna. The surface material, the metal layer, and the bottom material are connected to form a packaging material for making the package bag. The communication device is attached to the packaging material at a position corresponding to the slot antenna and can couple with the slot antenna, thereby forming an RFID tag on the packaging material. The fact that the slot antenna of the RFID tag is formed by the grooves of the metal layer effectively solves the problem of image pulses, which, as stated previously, are generated by a metal article and can render a conventional RFID tag incapable of RF signal transmission to and from a reader.

Another object of the present invention is to provide the foregoing package bag, wherein the communication device includes an attachment material, a conductive loop, and a communication chip. The attachment material has a larger configuration than the conductive loop, so as for the attachment material to attach the conductive loop to the package bag at a position corresponding to the first groove. The conductive loop is of a hollow and symmetric shape and includes two first conducting portions, two second conducting portions, two first connecting portions, and a second connecting portion. The first conducting portions correspond in position to the first impedance-matching portions respectively. Each first conducting portion has a first end connected to a first end of the corresponding second conducting portion. Each first conducting portion further has a second end connected to a first end of the corresponding first connecting portion. The second ends of the first connecting portions are spaced apart by a first distance, and the communication chip is provided at the second ends of the first connecting portions. The second conducting portions correspond in position to the second impedance-matching portions respectively. The second ends of the second conducting portions are in conduction with each other via the second connecting portion. Once the conductive loop is attached to the package bag, the first conducting portions do not overlap with the first impedance-matching portions, whereas the second conducting portions overlap with the second impedance-matching portions and can couple therewith respectively, thus forming the RFID tag. When the RFID tag receives an RF signal transmitted from a reader, the second conducting portions respectively and electromagnetically couple with the second impedance-matching portions such that two capacitive impedances are respectively generated therebetween. The second conducting portions are thus enabled to deliver the energy generated by electromagnetic induction of the slot antenna, so as for the data in the communication chip to be transmitted to the reader. As the RFID tag features optimization of coupling impedance-matching, the slot antenna can be effectively downsized. This allows the slot antenna to have the smallest size possible for achieving the desired transmission distance.

BRIEF DESCRIPTION OF THE SEVERAL VIEWS OF THE DRAWINGS

The structure as well as a preferred mode of use, further objects, and advantages of the present invention will be best understood by referring to the following detailed description of some illustrative embodiments in conjunction with the accompanying drawings, in which.

DETAILED DESCRIPTION OF THE INVENTION

Figure 1:
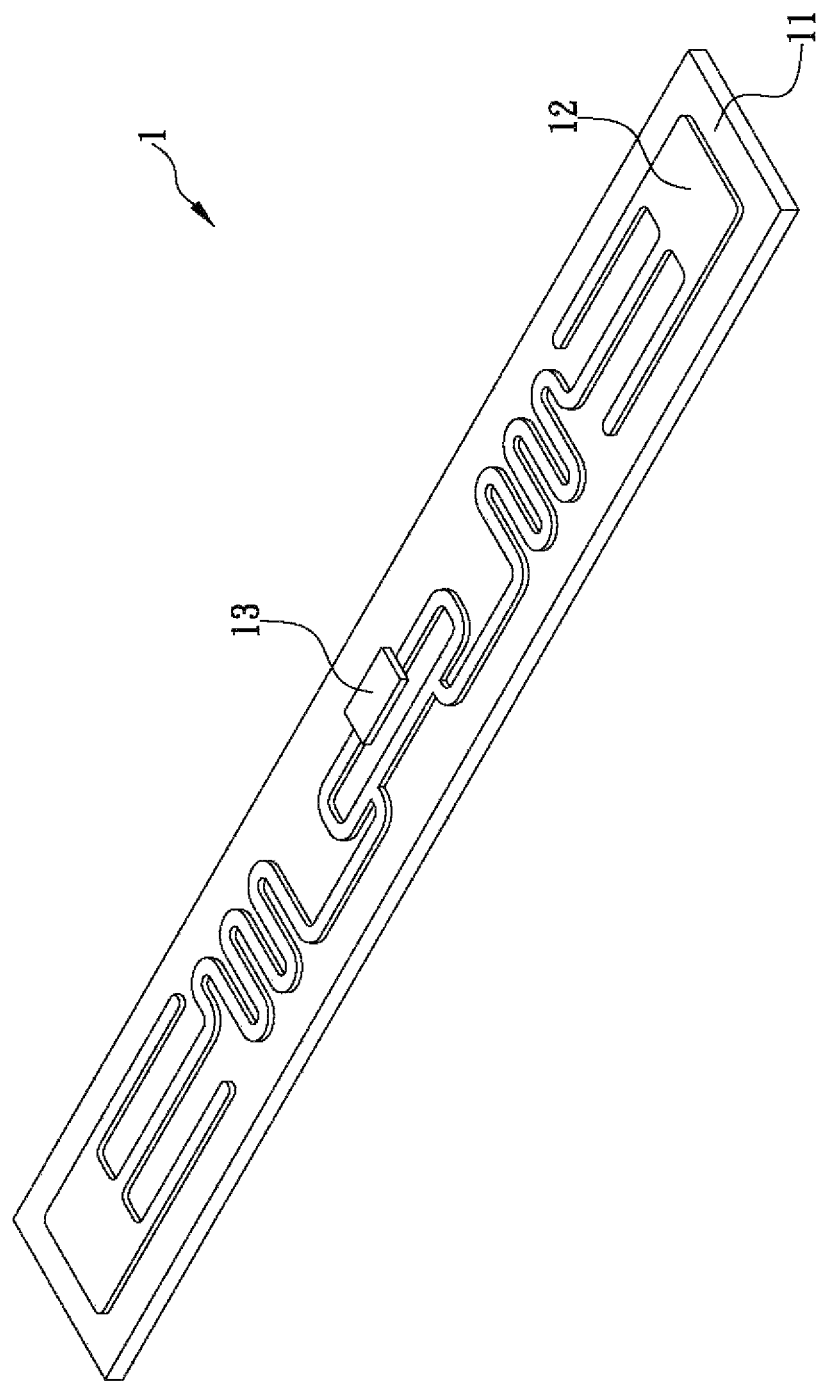
FIG. 1 is a perspective view of a conventional RFID tag.
Figure 2:
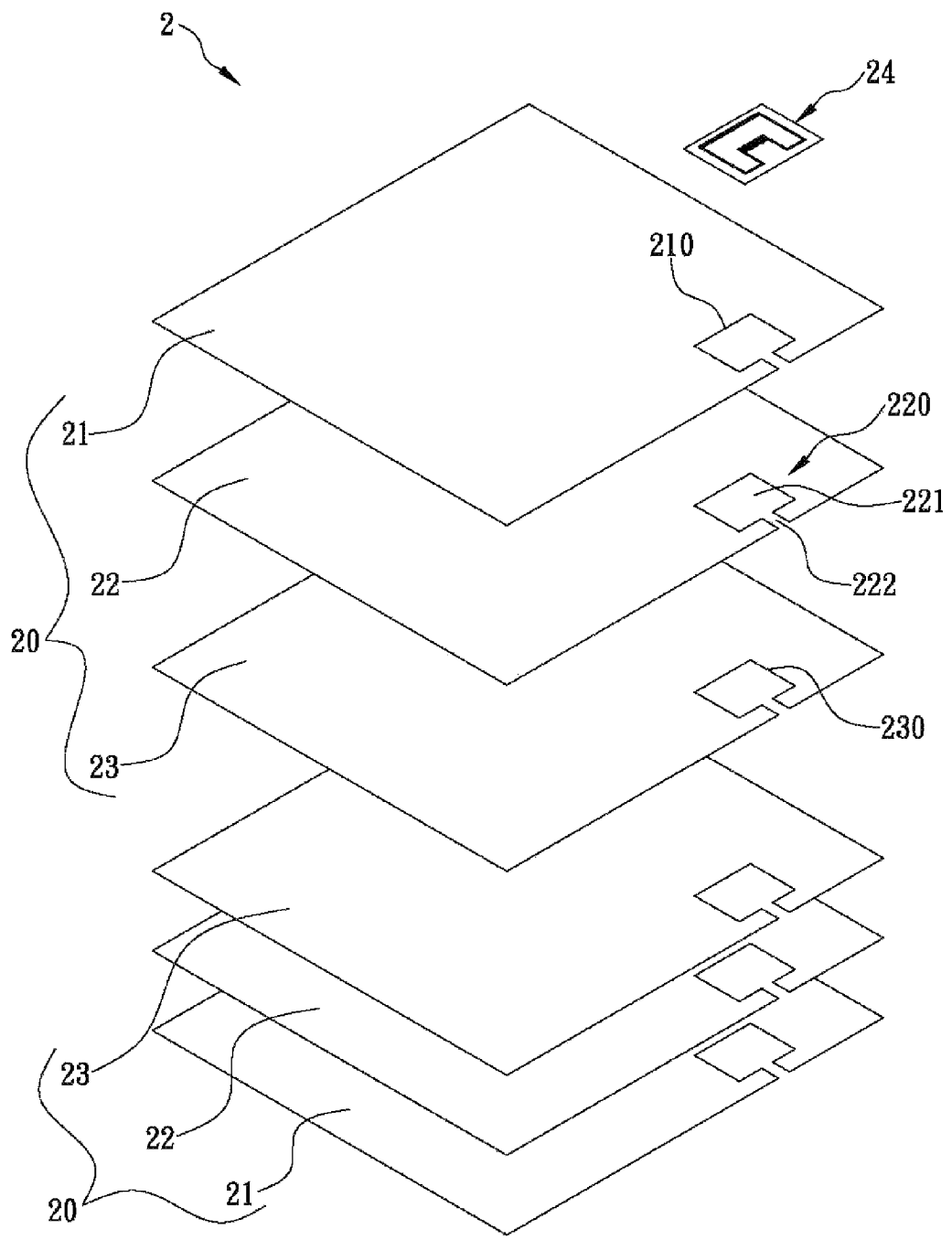
FIG. 2 is an exploded perspective view of the package bag according to the first preferred embodiment of the present invention.

The present invention discloses a package bag with an externally attached communication device. Referring to FIG. 2 for the first preferred embodiment of the present invention, the package bag 2 includes a surface material 21, a metal layer 22, a bottom material 23, and a communication device 24. The surface material 21 is a film made of plastic. The metal layer 22 has one surface coated on one surface of the surface material 21. The bottom material 23 is also a film made of plastic (e.g., linear low-density polyethylene) and is coated on the opposite surface of the metal layer 22 such that the surface material 21, the metal layer 22, and the bottom material 23 are connected to form a packaging material 20 for making the package bag 2. It should be pointed out that the metal layer 22 is depicted in FIG. 2 as a film only to facilitate disclosure of the components of the package bag 2. In practice, the metal layer 22 may be attached to the surface material 21 by evaporation, sputtering, or the like. In other preferred embodiments of the present invention, the surface material 21 and the metal layer 22 may be integrated to form a multilayer composite material (e.g., a composite material composed of polyethylene, an electroplated aluminum foil, etc.).

Figure 3:
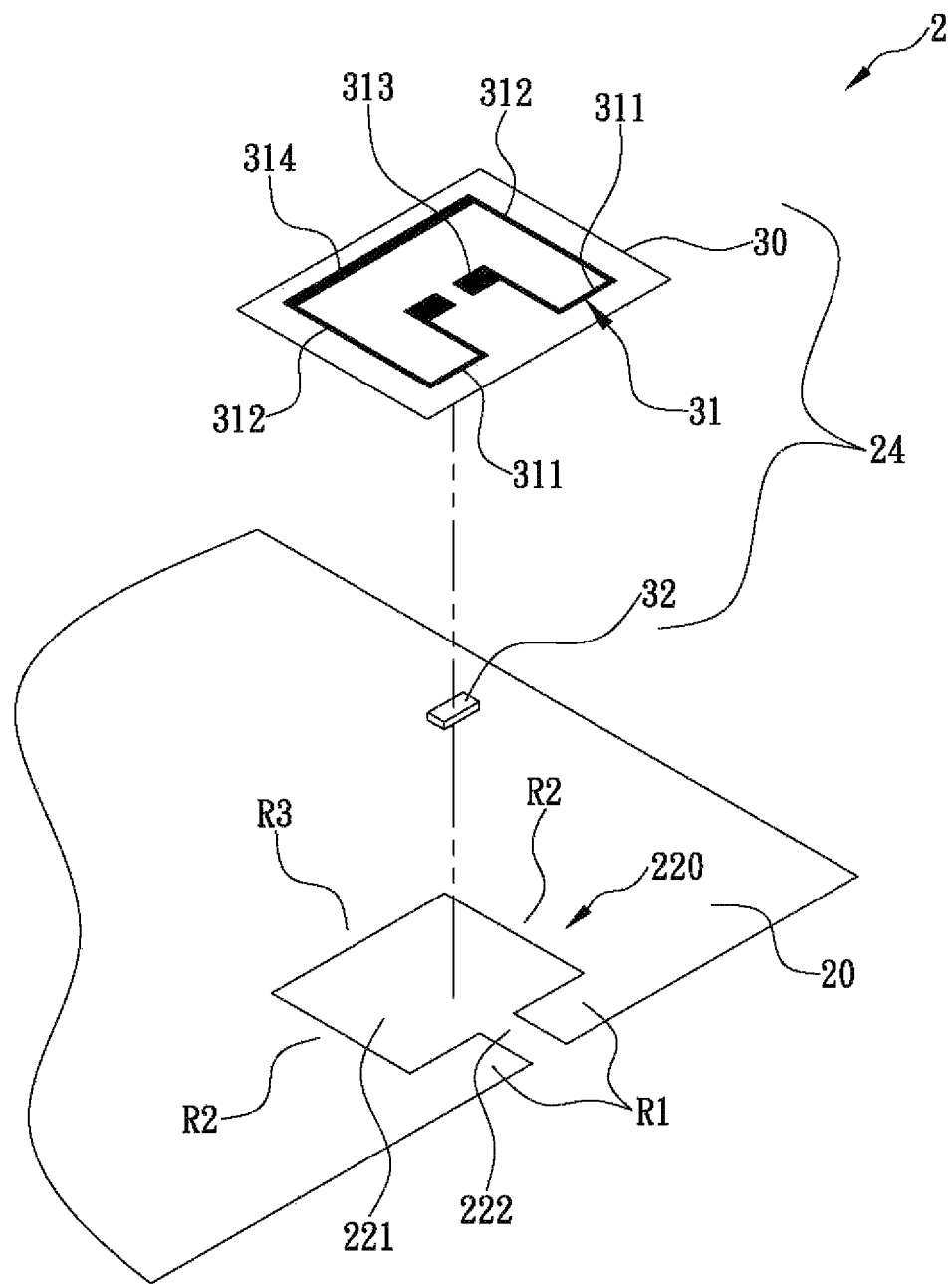
FIG. 3 is another exploded perspective view of the package bag according to the first preferred embodiment of the present invention.

To make the package bag 2, referring to FIGS. 2 and 3, a manufacturer may have two layers of packaging material 20 (each formed by the surface material 21, the metal layer 22, and the bottom material 23) sealed around their peripheries by a machine. Alternatively, a single layer of packaging material 20 may be curled, cut, and sealed by a machine in order to form the packaging bag 2. Afterward, the packaging material 20 is formed, by stamping for example, with grooves which have the same configuration and are located adjacent to one edge of the packaging material 20. As shown in the drawings, the surface material 21 and the bottom material 23 are respectively formed, by stamping, with an outer groove 210 and an inner groove 230 at corresponding positions, and the metal layer 22 is formed with a first groove 221 and a second groove 222 which correspond in position to the outer groove 210 and the inner groove 230. The first groove 221 and the second groove 222 jointly form a groove corresponding in configuration to the outer groove 210 and the inner groove 230. The first groove 221 has a rectangular configuration and is adjacent to one edge of the metal layer 22. The second groove 222, which is also configured as a rectangular opening, has a first side extending to the aforesaid edge of the metal layer 22 and a second side located away from the edge of the metal layer 22 and communicating vertically with a central section of a first side of the first groove 221. The second side of the second groove 222 has a shorter length than the first side of the first groove 221, such that the portions of the metal layer 22 that are adjacent to the first side of the first groove 221 form two first impedance-matching portions R1 respectively. In addition, the two corresponding portions of the metal layer 22 that are adjacent to the first groove 221 form two second impedance-matching portions R2 respectively. The first groove 221 further has a second side located away from the second groove 222, and the portion of the metal layer 22 that corresponds in position to the second side of the first groove 221 forms a third impedance-matching portion R3. As such, the first groove 221 and the second groove 222 of the metal layer 22 form a slot antenna 220.

Figure 4:
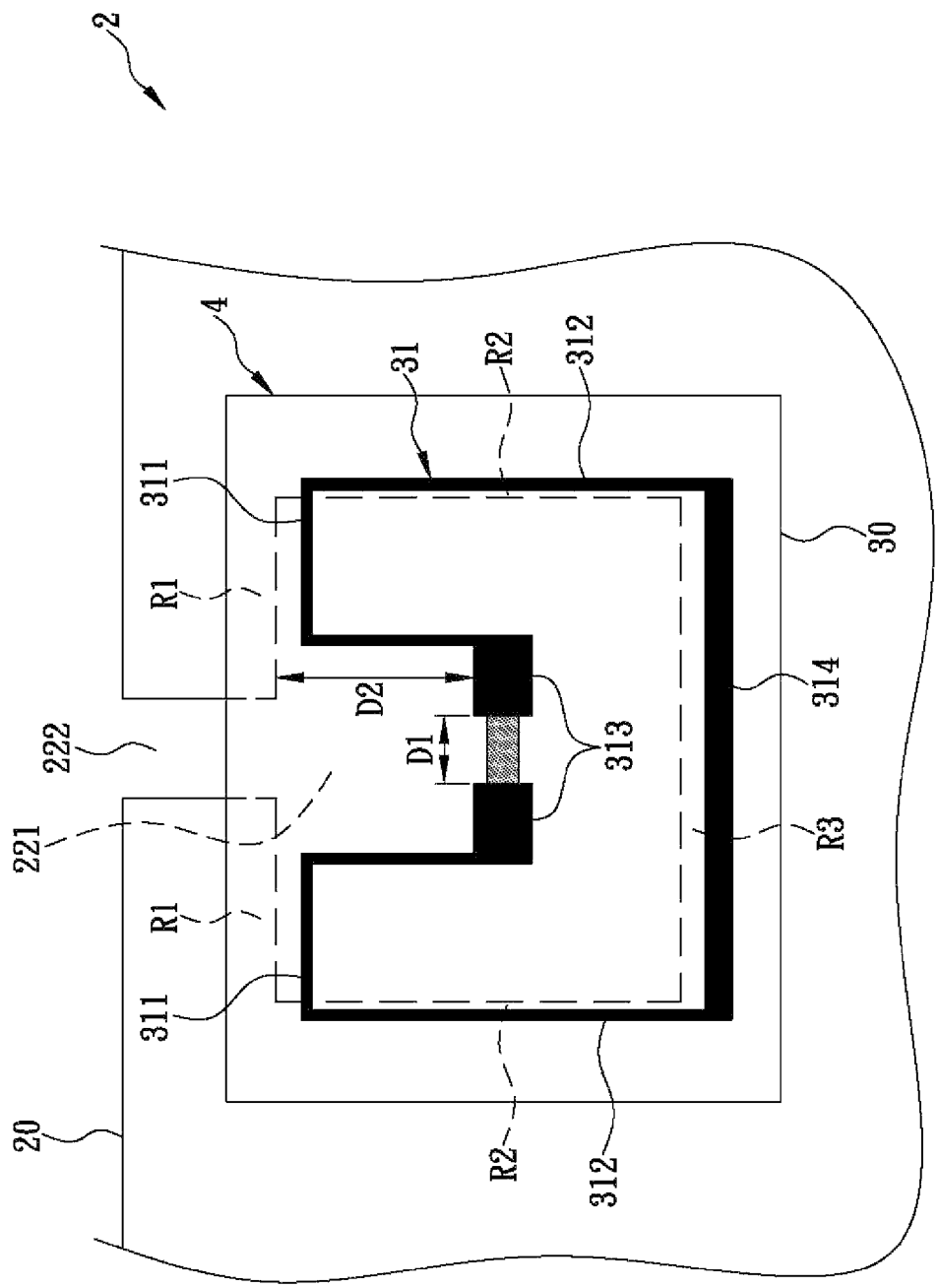
FIG. 4 is a partial assembled view of the package bag according to the first preferred embodiment of the present invention.

Referring to FIGS. 2~4, the communication device 24 includes an attachment material 30, a conductive loop 31, and a communication chip 32. The attachment material 30 has a larger configuration than the conductive loop 31, allowing the conductive loop 31 to be arranged on the attachment material 30 and be attached, via the attachment material 30, to the surface material 21 at a position corresponding to the first groove 221. The conductive loop 31 is of a hollow and symmetric shape, whose hollow portion is generally C-shaped. The conductive loop 31 includes two first conducting portions 311, two second conducting portions 312, two first connecting portions 313, and a second connecting portion 314. The first conducting portions 311 correspond in position to the first impedance-matching portions R1 respectively. Each first conducting portion 311 has a first end connected to a first end of the corresponding second conducting portion 312 and has a second end connected to a first end of the corresponding first connecting portion 313. The second ends of the first connecting portions 313 are spaced apart by a first distance D1 and are where the communication chip 32 is provided. The second conducting portions 312 correspond in position to the second impedance-matching portions R2 respectively. The second ends of the second conducting portions 312 are in conduction with each other via the second connecting portion 314. The second connecting portion 314 corresponds in position to and overlaps with the third impedance-matching portion R3 so as to couple therewith.

As shown in FIGS. 3 and 4, after the conductive loop 31 is attached to the packaging material 20, the first conducting portions 311 do not overlap with the first impedance-matching portions R1, and yet the second conducting portions 312 overlap, and can couple, with the second impedance-matching portions R2 respectively. Thus, the communication device 24 forms an RFID tag 4 on the package bag 2. More specifically, the area of the second groove 222 that corresponds to the conductive loop 31 functions as a loop antenna, which features a short read distance, and the first groove 221 functions as a dipole antenna, which features a long read distance.

Referring back to FIGS. 2~4, when the slot antenna 220 receives an RF signal transmitted from a reader, electromagnetic coupling takes place between the second conducting portions 312 and the second impedance-matching portions R2; as a result, a capacitive impedance is generated between each pair of the electromagnetically coupled portions 312 and R2. Through the capacitive impedances, the RFID tag 4 transmits the energy generated by electromagnetic induction of the slot antenna 220, allowing the data stored in the communication chip 32 to be sent to the reader by way of the slot antenna 220, so as for the information of the article in the package bag 2 to be known by the operator of the reader. The package bag of the present invention is advantageous chiefly in the following two respects:

(1) Prevention of destructive interference: As the metal layer 22 in the packaging material 20 is designed to form the slot antenna 220 of the RFID tag 4, the metal in the package bag will not cause destructive interference with RF signals transmitted by the RFID tag 4 as is often the case with the conventional RFID tags.

(2) Reduction in size of the slot antenna: The slot antenna 220 can be effectively downsized because the RFID tag 4 transmits data through optimized coupling impedance-matching, using energy generated by electromagnetic induction of the slot antenna 220. The slot antenna 220, therefore, is allowed to have the smallest possible size for achieving the desired transmission distance.

Referring again to FIG. 2, the present invention is applicable mainly to electroplated aluminum foil bags, in which case the surface material 21 is coated with the metal layer 22 by electroplating. Although the RFID tag 4 has an even greater transmission distance when applied to an ordinary aluminum foil bag, the RFID tag 4 is configured to be applicable particularly to electroplated aluminum foil bags with a view to meeting market demand, given the fact that electroplated aluminum foil bags are the market mainstream of package bags with a metal layer, advantageously featuring low costs, small overall thickness, ease of manufacture, and suitability for packaging articles which expire relatively fast (e.g., food). According to tests conducted by the inventor, the RFID tag 4 has a maximum read distance of about 2 m when applied to an electroplated package bag, which read distance is perfect for use in supermarkets, wholesale stores, etc. More particularly, a shop assistant can identify the article in the package bag within a medium-to-short distance without having to place a reader against the RFID tag 4. On the other hand, as the read distance of the RFID tag 4 is not as long as 6 to 7 m, a shopper's privacy is still ensured. The present invention effectively prevents those with ill intentions from secretly reading, with a reader, the information of articles bought by other shoppers.

As stated above, the RFID tag 4 can also be provided on an ordinary aluminum foil bag. Compared with the electroplated aluminum foil (whose thickness is approximately 0.1 nm) of an electroplated aluminum foil bag, the aluminum foil of an ordinary aluminum foil bag is much thicker (about 6~12 μm) and hence beneficial to the transmission of microwave signals. When applied to an ordinary aluminum foil bag, the RFID tag 4 has a transmission distance up to 4~5 m. Therefore, the package bag of the present invention may be made of an electroplated aluminum foil material or an ordinary aluminum foil material, depending on sale considerations or market demand. In other words, the RFID tag 4 may be configured for either medium-to-short-distance transmission that guarantees privacy or relatively long-distance transmission that enables product management in large quantities and volumes.

Referring to FIGS. 3 and 4, in the present embodiment, the first side of the first groove 221 is 10 mm long, the distance between the first and the second sides of the first groove 221 is 8 mm, the first side of the second groove 222 is 2 mm long, and the distance between the first and the second sides of the second groove 222 is 3 mm. Tests were conducted by the inventor using the aforesaid dimensions. Generally speaking, the length of a dipole antenna is one half of the wavelength (i.e., ½λ). At 915 MHz for example, the length of a dipole antenna should be about 16.4 cm, and yet the same antenna performance was achieved by the present invention with the antenna length (i.e., the horizontal length of the first groove 221) being only 1 cm. Moreover, the resulting RFID tag 4 had a read distance as long as 5 m. It is therefore unnecessary for a manufacturer to reserve a lot of space on the packaging material 20 for forming the slot antenna 220, and convenience of production is thus substantially enhanced. Also, the inventor has found after repeated tests that long-distance readability of the RFID tag 4 can be maintained within an expected range, provided that the specifications of the slot antenna 220 are within 20% of the foregoing specifications. In other words, the slot antenna 220 will have good wireless transmission abilities, provided that the first side of the first groove 221 has a length ranging from 8 to 12 mm, the distance between the first and the second sides of the first groove 221 ranges from 6.4 to 9.6 mm, the first side of the second groove 222 has a length ranging from 1.6 to 2.4 mm, and the distance between the first and the second sides of the second groove 222 ranges from 2.4 to 3.6 mm.

Figure 5A:
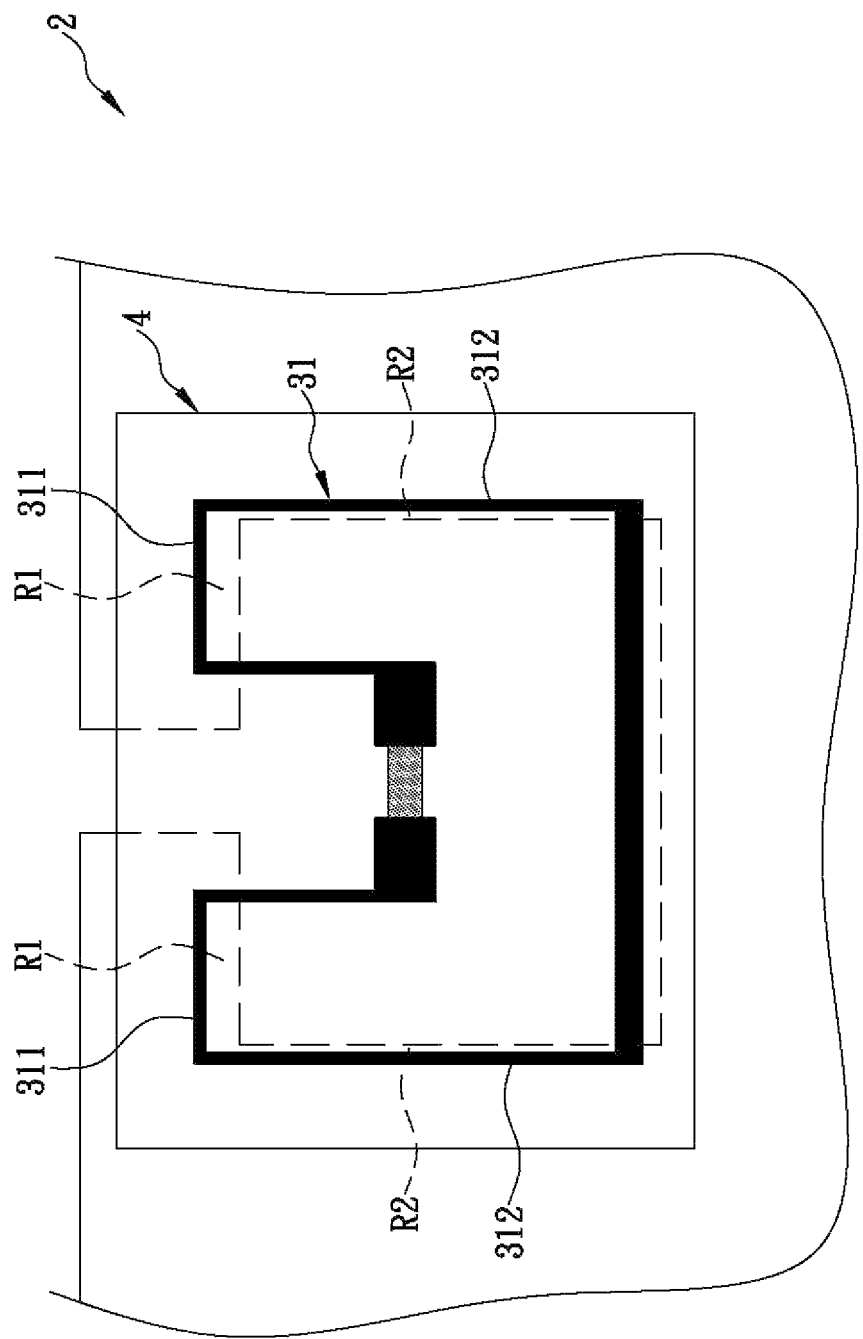
FIG. 5A is another partial assembled view of the package bag according to the first preferred embodiment of the present invention, showing assembly errors.
Figure 5B:
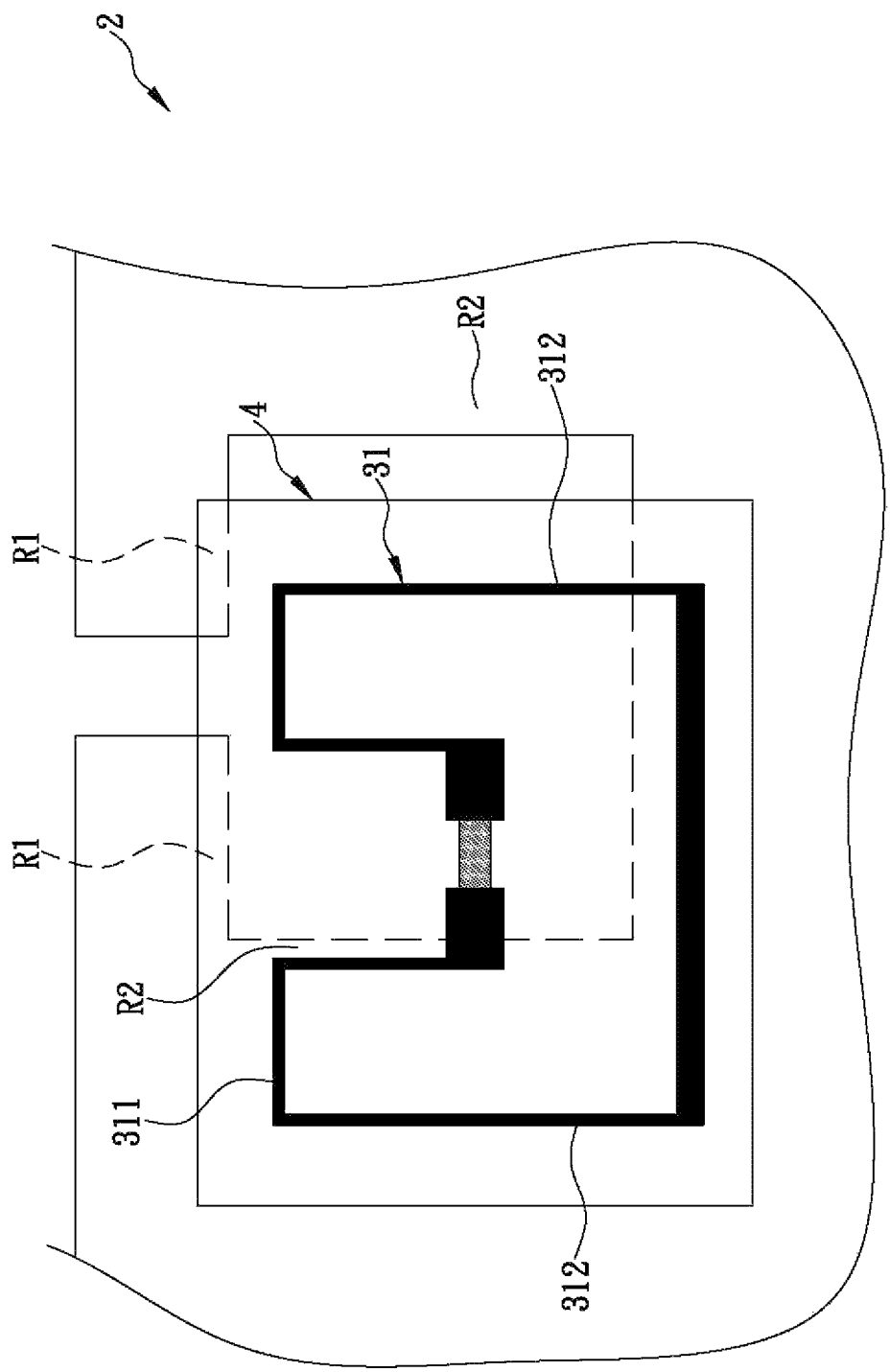
FIG. 5B is yet another partial assembled view of the package bag according to the first preferred embodiment of the present invention, showing assembly errors.

Reference is now made to FIGS. 2 and 3. As stated previously, in order for the communication device 24 to properly couple with the slot antenna 220 and thereby generate the capacitive impedances, not only must the second conducting portions 312 overlap with the second impedance-matching portions R2 respectively, but also the second connecting portion 314 must correspond in position to the third impedance-matching portion R3. Further, the conductive loop 31 must correspond in configuration to the slot antenna 220. Only with such an arrangement can energy generated by electromagnetic induction of the slot antenna 220 be properly transmitted. The inventor has found during the research and development process that, with the conductive loop 31 corresponding in configuration to the slot antenna 220, long-distance readability of the RFID tag 4 can stay within the expected range as long as the distance between each first conducting portion 311 and the corresponding edge of the first groove 221 is about 1 mm, the distance between each second conducting portion 312 and the corresponding edge of the first groove 221 is about 0.6 mm, and the vertical installation error (along the up-down direction of FIG. 4) of the conductive loop 31 is less than 1 mm or the horizontal installation error (along the left-right direction of FIG. 4) of the conductive loop 31 is less than 0.6 mm. Referring to FIGS. 5A and 5B, if the conductive loop 31 is displaced upward by more than 1 mm such that the first conducting portions 311 overlap with or are moved beyond the first impedance-matching portions R1, or if the conductive loop 31 is displaced leftward by more than 0.6 mm, long-distance readability of the RFID tag 4 will be substantially reduced.

Referring to FIGS. 3 and 4, in the second preferred embodiment of the present invention, the first connecting portions 313 are located between the first conducting portions 311 and the second connecting portion 314; as a result, the communication chip 32 is spaced from the first side of the first groove 221 by a second distance D2. Moreover, the communication chip 32 is located on a central axis of the first groove 221, allowing the feed-in ends of the communication chip 32 to be respectively and electrically connected to the second ends of the first connecting portions 313.

Figure 6A:
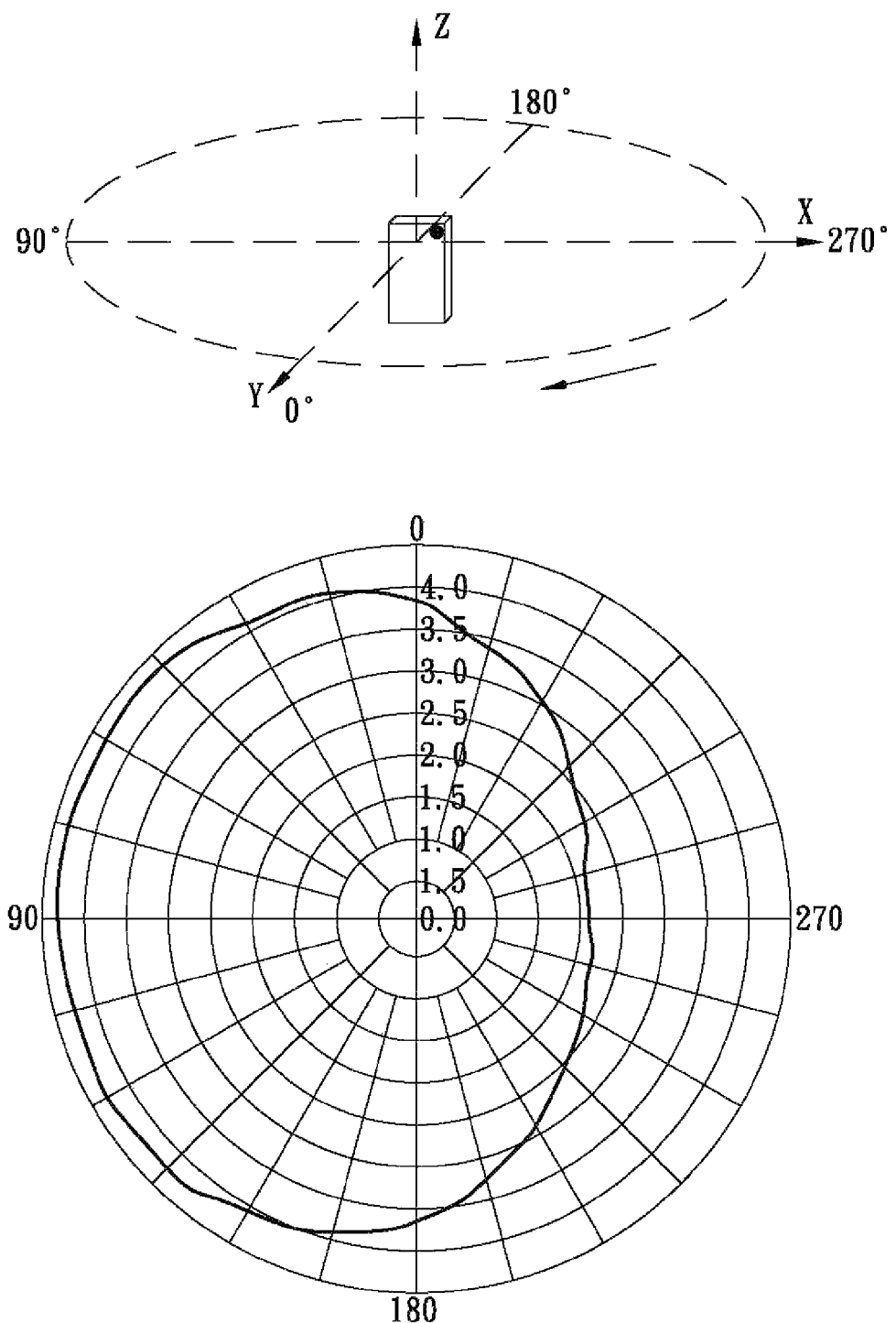
FIG. 6A shows the XZ-cut (vertical) scanning direction and radiation pattern of the package bag of the present invention.
Figure 6B:
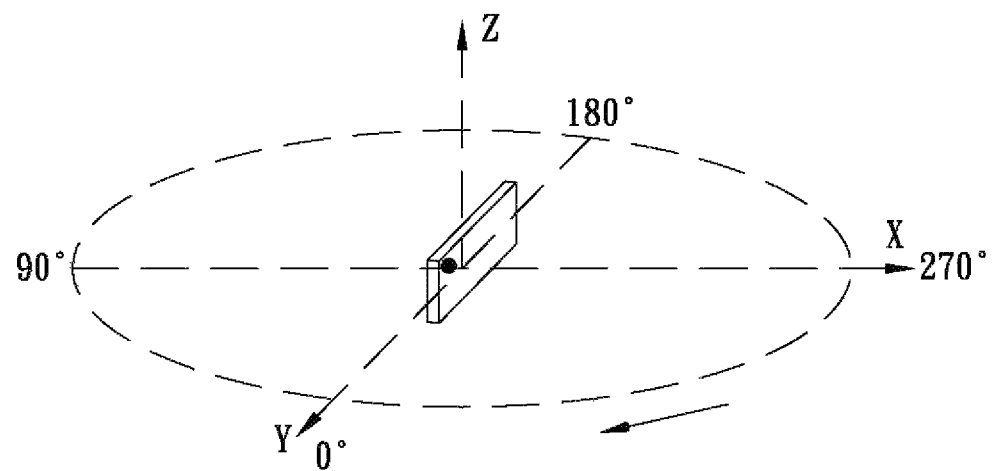
FIG. 6B shows the YZ-cut (horizontal) scanning direction and radiation pattern of the package bag of the present invention.
Figure 6B:
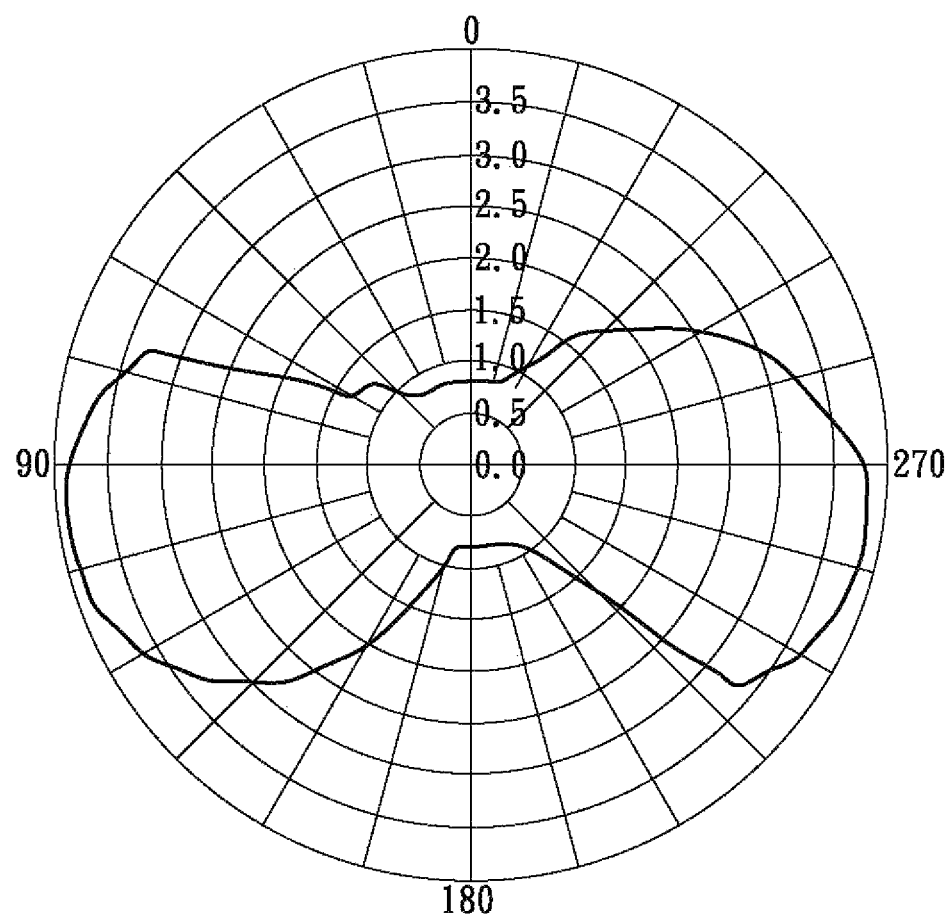
Figure 6C:
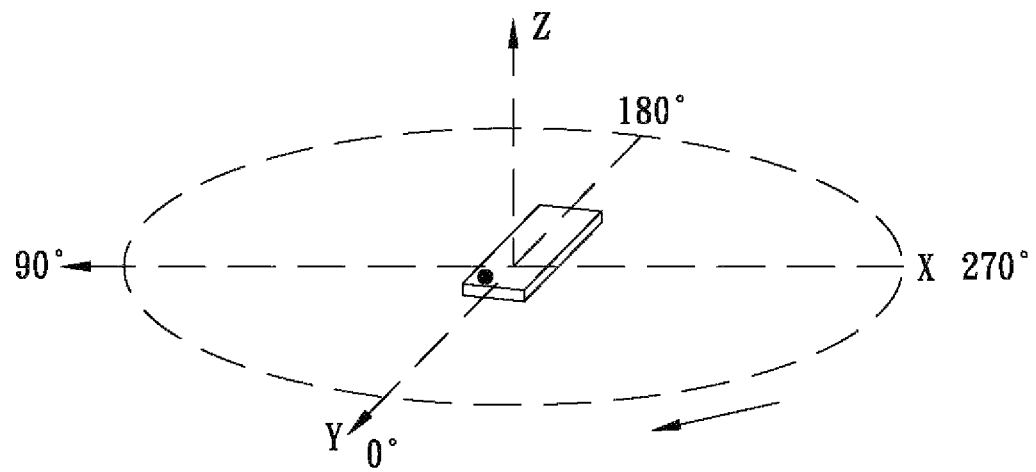
FIG. 6C shows the XY-cut (horizontal) scanning direction and radiation pattern of the package bag of the present invention.
Figure 6C:
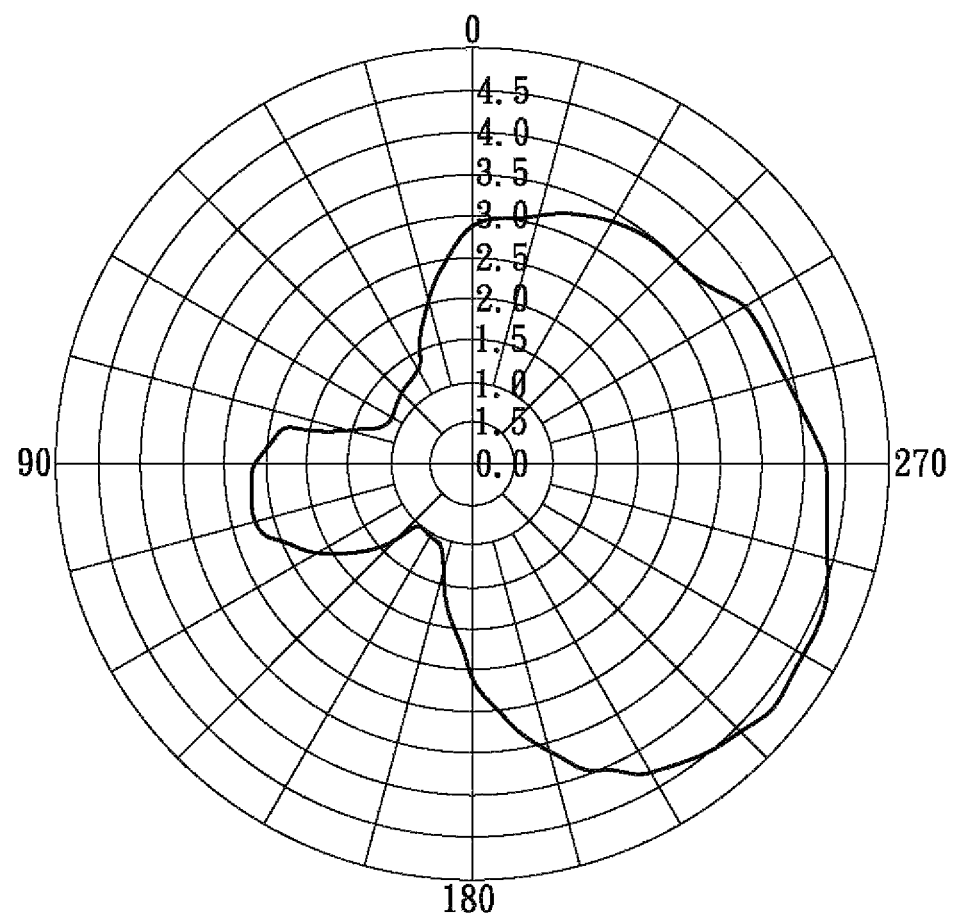

To clearly disclose the RFID capabilities of the package bag of the present invention, referring to FIGS. 2, 3, and 6A-6C, the radiation patterns of the RFID tag 4, when provided on the upper right corner of the package bag 2, were measured during transmission of RF signals in different directions. The results are plotted in FIGS. 6A-6C, in which FIG. 6A shows the XZ-cut (vertical) scanning direction and radiation pattern, FIG. 6B shows the YZ-cut (horizontal) scanning direction and radiation pattern, and FIG. 6C shows the XY-cut (horizontal) scanning direction and radiation pattern. According to the radiation patterns, the RFID tag 4 did work well, and the highest readability took place in the vertical direction of the package bag 2.

While the invention herein disclosed has been described by means of specific embodiments, numerous modifications and variations could be made thereto by those skilled in the art without departing from the scope of the invention set forth in the claims.

What is claimed is:

1. A package bag with an externally attached communication device, the package bag comprising:

a surface material which is a film made of plastic and is formed with an outer groove;

a metal layer having a surface coated on a surface of the surface material, the metal layer being formed with a first groove and a second groove, wherein the first groove and the second groove correspond in position to the outer groove, the first groove being located adjacent to an edge of the metal layer, the second groove having a first side extending to the edge of the metal layer, the second groove further having a second side which is away from the edge of the metal layer and communicates vertically with a central section of a first side of the first groove, the second side of the second groove having a shorter length than the first side of the first groove, such that portions of the metal layer that are adjacent to the first side of the first groove forms two first impedance-matching portions respectively and two corresponding portions of the metal layer that are adjacent to the first groove form two second impedance-matching portions respectively, thus the first groove and the second groove of the metal layer jointly forming a slot antenna;

a bottom material which is a film made of plastic, the bottom material having a surface coated on an opposite surface of the metal layer, the bottom material being formed with an inner groove corresponding in position to the slot antenna, wherein the surface material, the metal layer, and the bottom material are connected to form a packaging material for making the package bag; and the communication device comprising an attachment material, a conductive loop, and a communication chip, the attachment material having a larger configuration than the conductive loop, so as for the conductive loop to be arranged on the attachment material and be attached, via the attachment material, to the package bag at a position corresponding to the first groove, the conductive loop being of a hollow and symmetric shape, the conductive loop comprising two first conducting portions, two second conducting portions, two first connecting portions, and a second connecting portion, the first conducting portions corresponding in position to the first impedance-matching portions respectively, each said first conducting portion having a first end connected to a first end of a corresponding said second conducting portion, each said first conducting portion having a second end connected to a first end of a corresponding said first connecting portion, second ends of the first connecting portions being spaced apart by a first distance, the communication chip being provided at the second ends of the first connecting portions, the second conducting portions corresponding in position to the second impedance-matching portions respectively, second ends of the second conducting portions being in communication with each other via the second connecting portion, wherein, once the conductive loop is attached to the package bag, the first conducting portions do not overlap with the first impedance-matching portions, but the second conducting portions overlap, and can couple, with the second impedance-matching portions respectively, such that the communication device forms a radio frequency identification (RFID) tag on the package bag.

2. The package bag of claim 1, wherein the first groove has a second side away from the second groove, and a portion of the metal layer that is adjacent to the second side of the first groove forms a third impedance-matching portion, the third impedance-matching portion overlapping, and being able to couple, with the second connecting portion once the conductive loop is attached to the package bag.

3. The package bag of claim 2, wherein the first connecting portions are located between the first conducting portions and the second connecting portion, such that the communication chip and the first side of the first groove are spaced apart by a second distance.

4. The package bag of claim 3, wherein the first groove is configured as a rectangular opening, the first side of the first groove having a length ranging from 8 mm to 12 mm, the first side and the second side of the first groove being spaced apart by a distance ranging from 6.4 mm to 9.6 mm.

5. The package bag of claim 4, wherein the second groove is configured as a rectangular opening, the first side of the second groove having a length ranging from 1.6 mm to 2.4 mm, the first side and the second side of the second groove being spaced apart by a distance ranging from 2.4 mm to 3.6 mm.

6. The package bag of claim 5, wherein the communication chip is located on a central axis of the first groove.

7. The package bag of claim 6, wherein the length of the first side of the first groove is 10 mm, the distance between the first side and the second side of the first groove is 8 mm, the length of the first side of the second groove is 2 mm, and the distance between the first side and the second side of the second groove is 3 mm.

8. The package bag of claim 7, wherein each said first conducting portion is spaced from a corresponding edge of the first groove by a distance less than 1 mm, and each said second conducting portion is spaced from a corresponding edge of the first groove by a distance less than 0.6 mm.

\* \* \* \* \*